(12) United States Patent
Mardi et al.

(10) Patent No.: US 10,613,137 B2
(45) Date of Patent: Apr. 7, 2020

(54) PROBE HEAD SECURING MECHANISM FOR PROBE ASSEMBLY

(71) Applicant: Xilinx, Inc., San Jose, CA (US)

(72) Inventors: Mohsen H. Mardi, Saratoga, CA (US); Lik Huay Lim, Singapore (SG); King Yon Lew, Simei (SG); Andy Widjaja, Singapore (SG)

(73) Assignee: XILINX, INC., San Jose, CA (US)

( * ) Notice: Subject to any disclaimer, the term of this patent is extended or adjusted under 35 U.S.C. 154(b) by 320 days.

(21) Appl. No.: 15/829,676

(22) Filed: Dec. 1, 2017

(65) Prior Publication Data
US 2019/0170816 A1 Jun. 6, 2019

(51) Int. Cl.
*G01R 31/20* (2006.01)
*G01R 31/26* (2020.01)
*G01R 31/28* (2006.01)

(52) U.S. Cl.
CPC .................. *G01R 31/2889* (2013.01)

(58) Field of Classification Search
CPC ............ G01R 31/2889; G01R 31/2891; G01R 31/2887; G01R 1/07307; G01R 1/07357; G01R 1/0416
See application file for complete search history.

(56) References Cited

U.S. PATENT DOCUMENTS

| | | | | |
|---|---|---|---|---|
| 8,710,855 B2* | 4/2014 | Namiki | ............. | G01R 31/2887 324/750.16 |
| 9,797,928 B2* | 10/2017 | Audette | ............. | G01R 1/07307 |
| 2010/0079161 A1* | 4/2010 | Endo | ................. | G01R 31/2887 324/754.12 |

* cited by examiner

*Primary Examiner* — Minh N Tang
(74) *Attorney, Agent, or Firm* — Patterson + Sheridan, LLP

(57) ABSTRACT

Methods and apparatus are described relating to a probe assembly having a probe head securing mechanism that includes a lock ring housing and a lock ring disposed in the lock ring housing. In an example, a probe assembly includes a rigid substrate, a circuit board coupled to the rigid substrate, and a probe head securing mechanism. The probe head securing mechanism includes a lock ring housing and a lock ring disposed within the lock ring housing. The circuit board has a surface. The lock ring housing is coupled to the rigid substrate. The circuit board is disposed between the lock ring housing and the rigid substrate. The lock ring is rotatable relative to the lock ring housing. Rotation of the lock ring is configured to move the lock ring in a direction perpendicular to the surface of the circuit board.

20 Claims, 14 Drawing Sheets

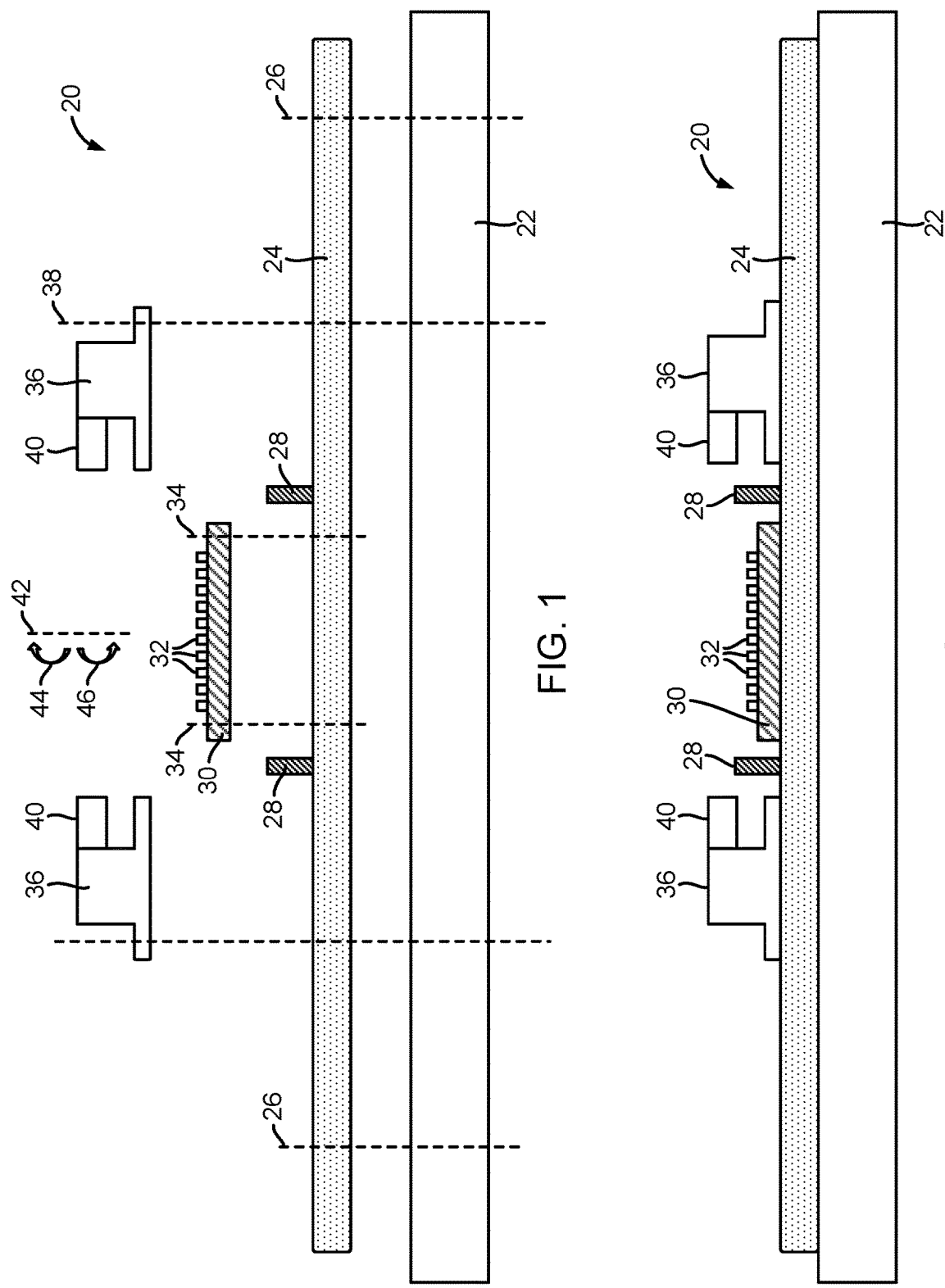

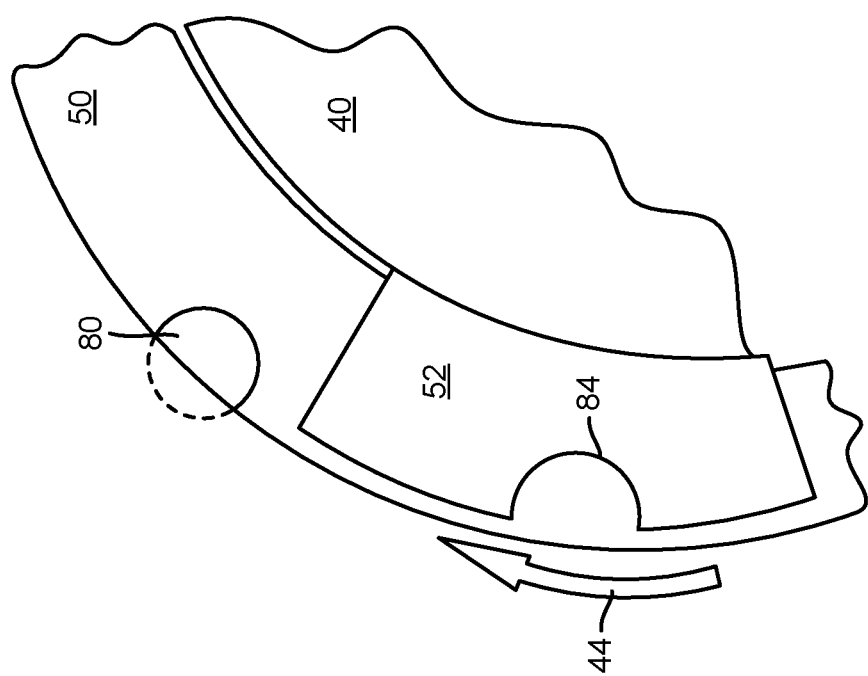
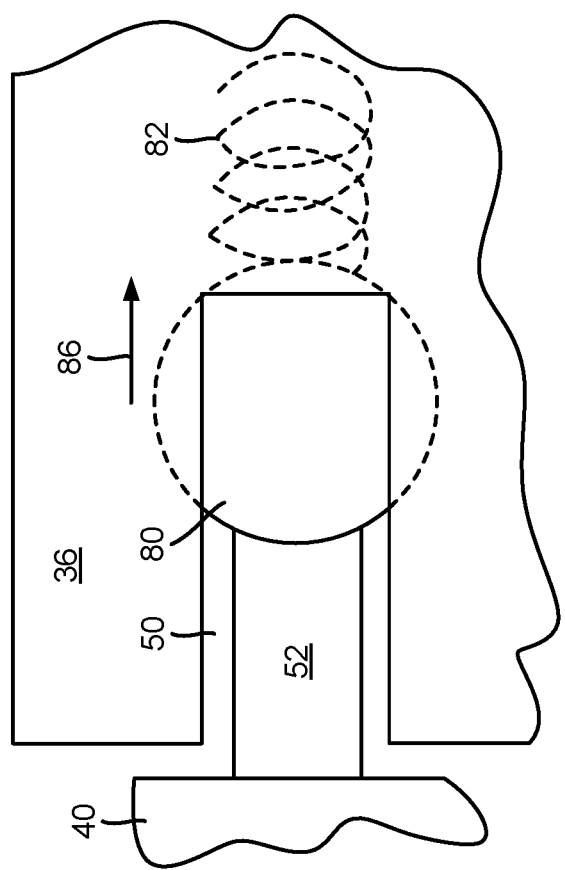
FIG. 6B
FIG. 6A

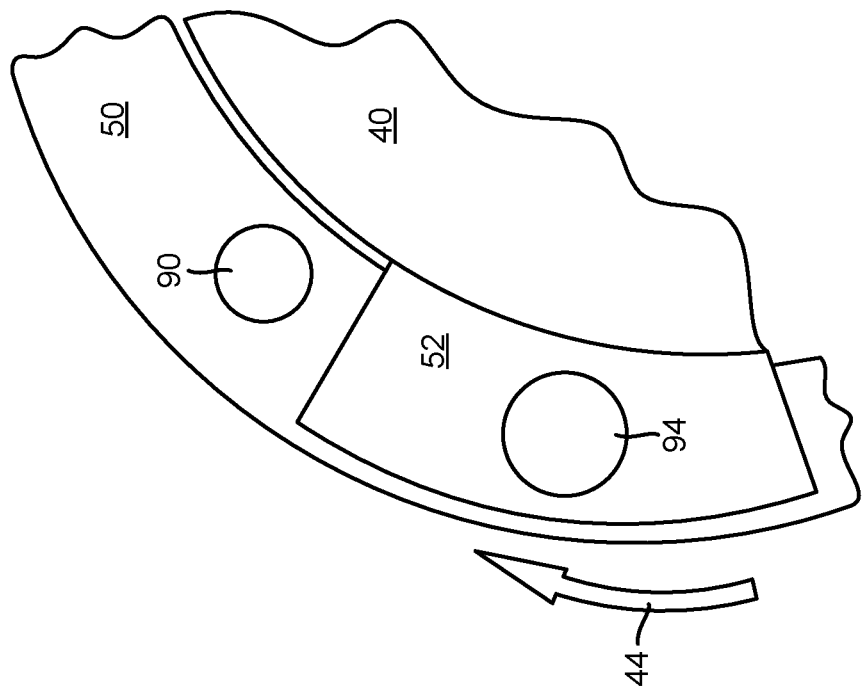
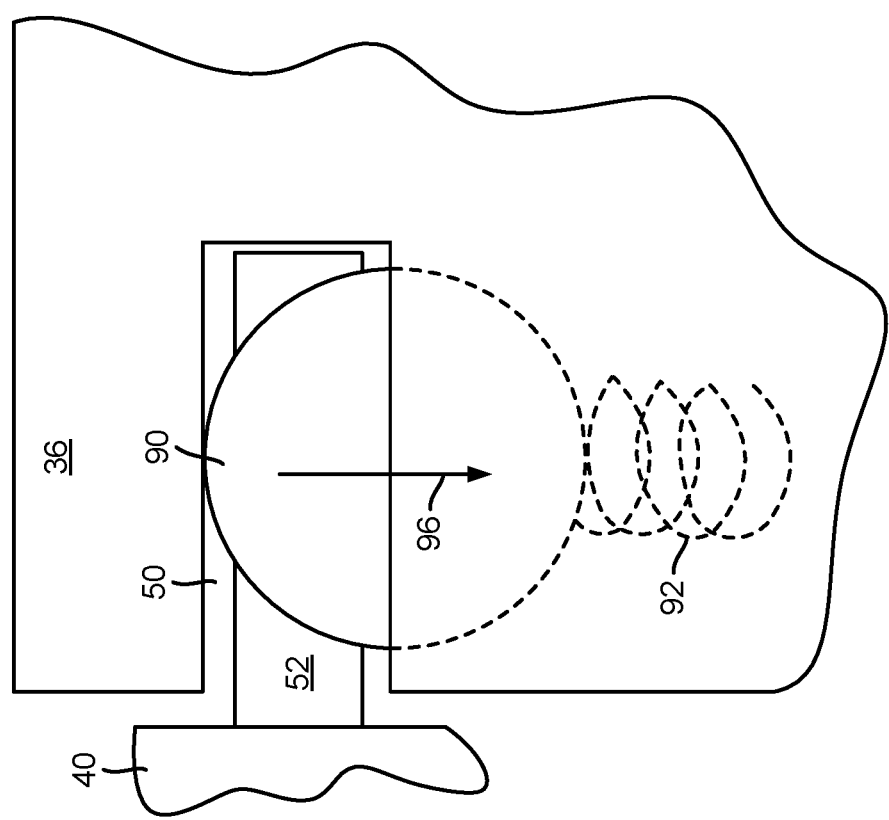

PROBE HEAD SECURING MECHANISM FOR PROBE ASSEMBLY

TECHNICAL FIELD

Examples of the present disclosure generally relate to a probe assembly for wafer testing and, in particular, to a probe head securing mechanism having a lock ring incorporated into a probe assembly.

BACKGROUND

In semiconductor processing, integrated circuits are generally formed on dies on a wafer. Processing for forming the integrated circuits can be subject to variation and error. To address this, designers can implement test structures in the wafer, such as along scribe lines between dies. The test structures and/or the integrated circuit of each die can be subjected to testing to help ensure that each integrated circuit is fully functional.

Probe testing (or wafer sorting) is a testing mechanism for testing test structures and/or integrated circuits on a wafer. Probe testing can provide electrical signals at contact pads on the wafer, and can determine whether the integrated circuit or test structure under test is functional based on responses of the integrated circuit or test structure to the electrical signals. A probe assembly can provide an interface between the wafer to be tested and a processor-based system (e.g., a computer) that provides the electrical signals and receives the responses to those electrical signals.

SUMMARY

Examples of the present disclosure generally relate to a probe assembly having a probe head securing mechanism for securing, e.g., a probe head assembly to the probe assembly, which may facilitate changing the probe card in the probe assembly. In some examples, the probe head securing mechanism includes a lock ring housing and a lock ring disposed in the lock ring housing.

One example of the present disclosure is a probe assembly. The probe assembly includes a rigid substrate, a circuit board coupled to the rigid substrate, and a probe head securing mechanism. The probe head securing mechanism includes a lock ring housing and a lock ring disposed within the lock ring housing. The circuit board has a surface. The lock ring housing is coupled to the rigid substrate. The circuit board is disposed between the lock ring housing and the rigid substrate. The lock ring is rotatable relative to the lock ring housing. Rotation of the lock ring is configured to move the lock ring in a direction perpendicular to the surface of the circuit board.

Another example of the present disclosure is a method for testing. A probe head assembly is secured in a probe assembly, and a wafer is tested using the probe head assembly secured in the probe assembly. Securing the probe head assembly includes inserting the probe head assembly through a lock ring of the probe assembly. The lock ring is at a first position relative to a lock ring housing of the probe assembly. The lock ring is disposed in the lock ring housing of the probe assembly. The lock ring housing is attached to a rigid substrate of the probe assembly, and a circuit board is disposed between the lock ring housing and the rigid substrate. Securing the probe head assembly further includes rotating the lock ring relative to the lock ring housing to a second position relative to the lock ring housing. The lock ring at the second position applies a force to the probe head assembly to secure the probe head assembly.

Yet another example of the present disclosure is a probe assembly. The probe assembly includes a rigid substrate, a circuit board coupled to the rigid substrate, and a probe head securing mechanism. The probe head securing mechanism includes a lock ring and a lock ring housing coupled to the rigid substrate. The circuit board is disposed between the lock ring housing and the rigid substrate. The lock ring has a flange along a lateral exterior. The lock ring housing has an interior sidewall at least partially encircling the lock ring, and the interior sidewall has a helical channel. The flange of the lock ring is engaged in the helical channel. The lock ring is rotatable relative to the lock ring housing, and the flange is moveable along the helical channel during rotation of the lock ring.

Yet another example of the present disclosure is a probe head securing mechanism. The probe head securing mechanism generally includes a lock ring housing and a lock ring disposed within the lock ring housing, the lock ring being rotatable relative to the lock ring housing, rotation of the lock ring being configured to move the lock ring in a direction perpendicular to a surface of the lock ring housing.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

FIG. 1 is an exploded cross-sectional view of an example probe assembly, in accordance with an example of the present disclosure.

FIG. 2 is an assembled cross-sectional view of the example probe assembly of FIG. 1, in accordance with an example of the present disclosure.

FIGS. 6A and 6B are a cross-sectional view and a plan view, respectively, of a first example locking mechanism in an "unlocked" position, in accordance with an example of the present disclosure.

FIGS. 8A and 8B are a cross-sectional view and a plan view, respectively, of a second example locking mechanism in an "unlocked" position, in accordance with an example of the present disclosure.

To facilitate understanding, identical reference numerals have been used, where possible, to designate identical elements that are common to the figures. It is contemplated that elements of one example may be beneficially incorporated in other examples.

DETAILED DESCRIPTION

Figure 3:
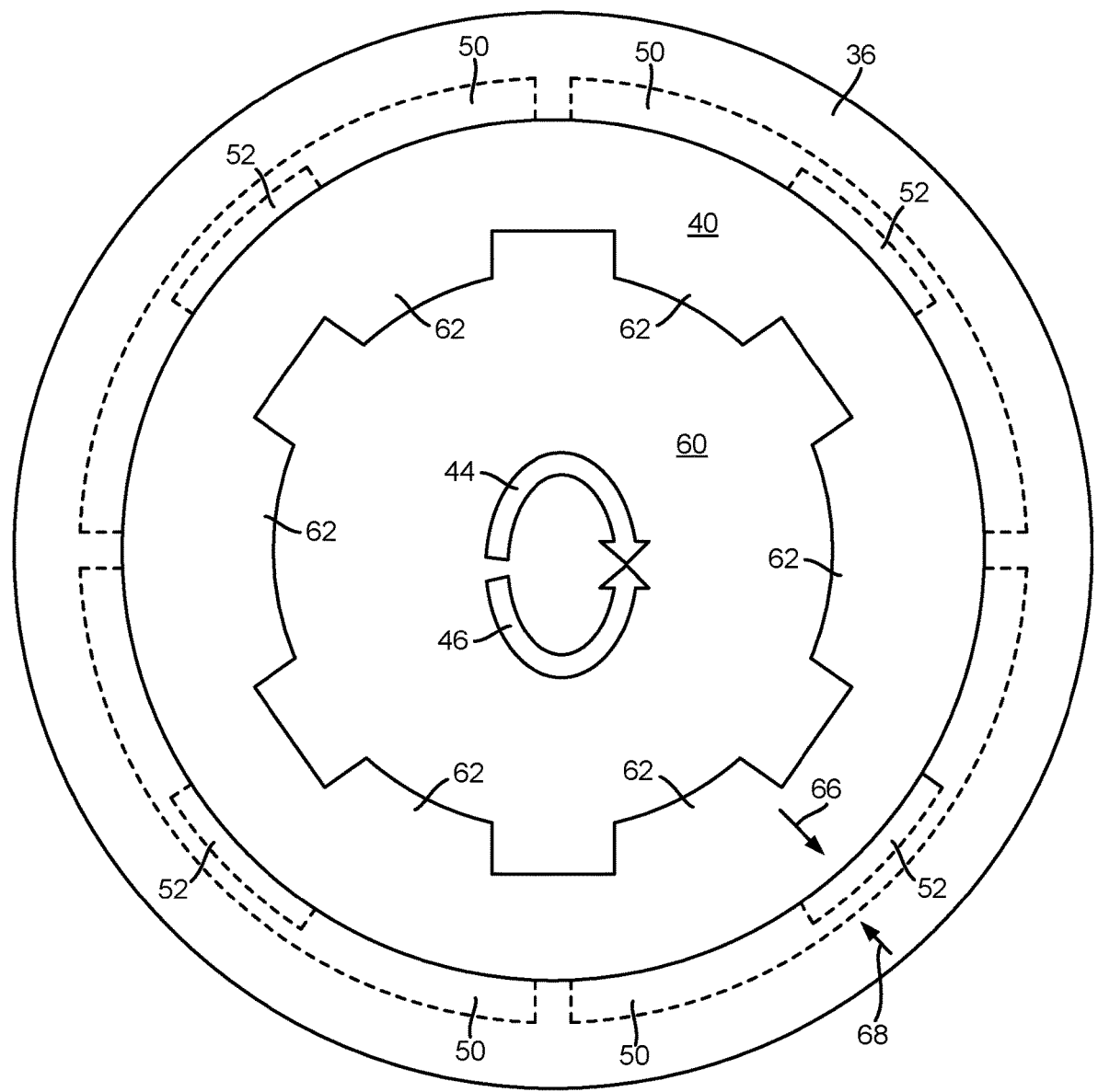
FIG. 3 is a top view of a lock ring housing with a lock ring, in accordance with an example of the present disclosure.

Examples of the present disclosure provide for a probe assembly and a probe head assembly. The probe head assembly may be easily inserted and secured in the probe assembly using a probe securing mechanism, such as without the use of any tool. Hence, in some examples, different probe head assemblies configured for wafer sorting or probe testing wafers with different integrated circuits and/or test structures can be easily and quickly changed out to transition between wafer sorting or probe testing those wafers. Furthermore, such a probe head assembly may prevent wear on portions of the probe head assembly or fasteners used to secure the probe head assembly to the probe assembly, which might otherwise lead to debris on a wafer and impact the testing yield.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described.

Further, a person having ordinary skill in the art will readily understand various modifications to examples described herein, which modifications are also contemplated within the scope of other examples. For example, components illustrated or described as a single integrated component may include multiple components secured together. Also, patterns and/or layouts of various components illustrated and described are merely examples, and other patterns and/or layouts may be implemented in other examples. Further, rotational directions described herein may be reversed in other examples, and/or aspects of various different rotations may be combined in other examples.

FIGS. 1 and 2 are an exploded cross-sectional view and an assembled cross-sectional view, respectively, of an example probe assembly 20, in accordance with an example of the present disclosure. The probe assembly 20 includes a rigid substrate 22, a circuit board 24, an interposer substrate 30, and a lock ring housing 36 with a lock ring 40. The rigid substrate 22 (which may also be referred to as a stiffener) can be any substrate that is rigid and provides physical support and integrity to components attached to the rigid substrate 22. In some examples, the rigid substrate 22 can be a steel substrate, a stainless steel substrate, an aluminum substrate, a titanium substrate, or another rigid substrate. The circuit board 24 can be a substrate that provides for a first level of electrical interconnections between, e.g., a processor-based system like a computer and a second, smaller level of electrical interconnections. In some examples, the circuit board 24 is a printed circuit board (PCB) or another circuit board. The circuit board 24 is secured to the rigid substrate 22 along example axes 26 using, for example, screws, bolts, rivets, or another securing mechanism. The circuit board 24 further includes guide pins 28 that extend from the circuit board 24 for aligning a probe head assembly, which will be described subsequently.

The interposer substrate 30 can provide the second, smaller level of electrical interconnections between the circuit board 24 and the probe head assembly. The interposer substrate 30 can be a silicon or glass substrate or another substrate that can provide the electrical interconnections, such as using vias (not shown) and contacts 32 (e.g., pogo pins), to the probe head assembly. The interposer substrate 30 may be secured to the circuit board 24 along example axes 34 using, for example, screws, bolts, rivets, or another securing mechanism.

The lock ring housing 36 includes a circular, rigid base that houses the lock ring 40. The lock ring housing 36 may be secured on the circuit board 24 around the guide pins 28 and interposer substrate 30 (e.g., where the probe assembly is to be secured). As described in further detail below, the lock ring housing 36 includes one or more helical channels that engage a respective flange of the lock ring 40. The lock ring housing 36 can be a steel housing or another type of housing, in some examples. The lock ring housing 36 may be secured to the rigid substrate 22 (e.g., through the circuit board 24) along example axes 38 using, for example, screws, bolts, rivets, or another securing mechanism. The lock ring 40 can be a rigid ring, such as formed from steel or another rigid material, in some examples.

The lock ring 40 is disposed within the lock ring housing 36 and is rotatable within the lock ring housing 36 in a clockwise direction 44 and counterclockwise (anticlockwise) direction 46 around an axis 42. The flanges of the lock ring 40 are capable of sliding along the respective helical channels of the lock ring housing 36 to permit rotation of the lock ring 40. As the lock ring 40 rotates in the clockwise direction 44, the lock ring 40 is brought downward towards the interposer substrate 30 and circuit board 24. As will become apparent, the helical channels of the lock ring housing 36 direct the flanges of the lock ring 40, and hence, the lock ring 40 itself, downward as the lock ring 40 rotates in the clockwise direction 44. By bringing the lock ring 40 downward, the lock ring 40 is capable of applying a force to the probe head assembly to secure the probe head assembly in electrical contact with the interposer substrate 30. Conversely, as the lock ring 40 rotates in the counterclockwise direction 46, the lock ring 40 is brought upward away from the interposer substrate 30 and circuit board 24. As will become apparent, the helical channels of the lock ring housing 36 direct the flanges of the lock ring 40, and hence, the lock ring 40 itself, upward as the lock ring 40 rotates in the counterclockwise direction 46. By bringing the lock ring 40 upward, the lock ring 40 is capable of removing force from the probe head assembly to permit removing the probe head assembly from the probe assembly 20.

FIG. 3 is a top view of the lock ring housing 36 with the lock ring 40, in accordance with an example of the present disclosure. The lock ring housing 36 has helical channels 50 (shown in phantom) along an interior sidewall of the lock ring housing 36. The lock ring 40 has flanges 52 (also shown in phantom) along a lateral exterior of the lock ring 40. Each flange 52 is inserted into and engages a respective helical channel 50. The length of each helical channel 50 (e.g., along the interior sidewall of the lock ring housing 36) and a corresponding length of each flange 52 are sufficient to permit movement of the flanges 52 within and along the respective helical channels 50 to permit the lock ring 40 to rotate (e.g., in the clockwise and counterclockwise directions 44 and 46) between a "lock" position and an "unlock" position. The helical channel 50 and the flange 52 may be configured to prohibit downward movement of the lock ring 40 past a desired point. For example, the lengths of the helical channel 50 and the flange 52 may be such that rotation of the lock ring 40 in the clockwise direction 44 may be prevented, and hence, downward movement of the lock ring 40 stopped, when a forward-most edge of the flange 52 (in the clockwise direction 44) meets an end and lower-most point of the helical channel 50. For example, a wall may terminate the end and lower-most point of the helical channel 50. An additional and/or alternative type of hard stop may be used to prohibit over-rotation of the lock ring 40.

There may be an aperture 60 through the lock ring 40, as shown. The aperture 60 may have a layout pattern corresponding to a layout pattern of the probe head assembly. As illustrated, the lock ring 40 has an inner lateral surface with projections 62 that define, at least in part, the pattern of the aperture 60. As described subsequently, the probe head assembly can have projections that align between projections 62 of the lock ring 40 when the lock ring 40 is in the "unlock" position and that align below and in contact with projections 62 of the lock ring 40 when the lock ring 40 is in the "lock" position. Other configurations of the aperture 60 may be implemented in different examples.

Figure 4:
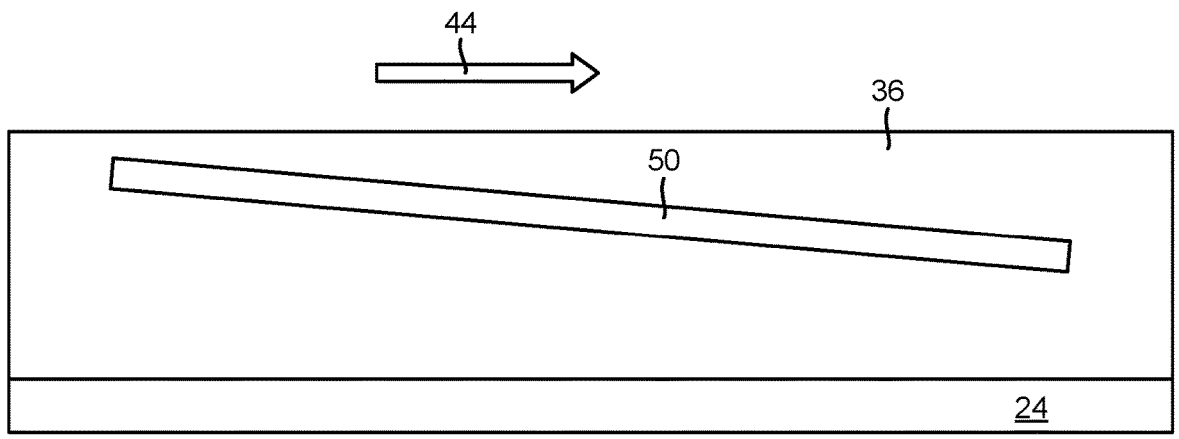
FIG. 4 is a side view of a portion of the lock ring housing having a helical channel, in accordance with an example of the present disclosure.

FIG. 4 is a side view of a portion of the lock ring housing 36 having a helical channel 50, in accordance with an example of the present disclosure. The side view is along a direction 66 shown in FIG. 3 from the interior of the lock ring housing 36 outward. The side view is of a portion of the interior sidewall of the lock ring housing 36 that has a helical channel 50 and at least partially encircles the lock ring 40. As illustrated, the helical channel 50 is inclined downwardly toward the circuit board 24 in the clockwise direction 44.

Figure 5:
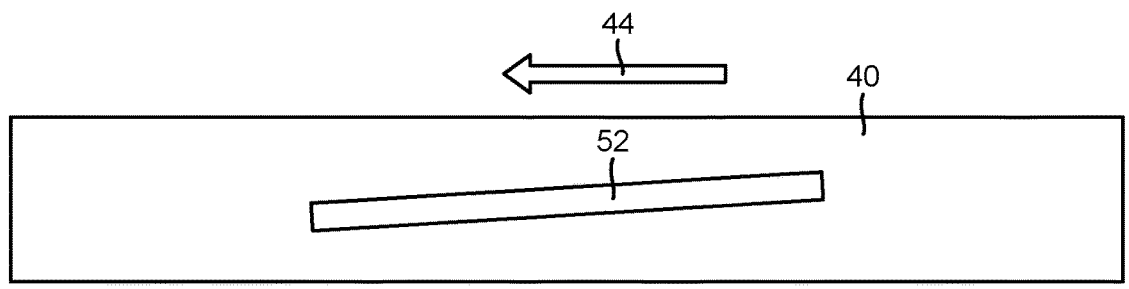
FIG. 5 is a side view of a portion of the lock ring having a flange, in accordance with an example of the present disclosure.

FIG. 5 is a side view of a portion of the lock ring 40 having a flange 52, in accordance with an example of the present disclosure. The side view is along a direction 68 shown in FIG. 3 from the exterior of the lock ring 40 inward (e.g., opposing direction 66). The side view is of a portion of the lateral exterior of the lock ring 40 that has a flange 52.

Note that due to the opposing directional views of FIGS. 4 and 5, the side views are effectively mirrored views of corresponding features. As illustrated in FIG. 5, the flange 52 is inclined downwardly toward the circuit board 24 in the clockwise direction 44. Hence, as is apparent from FIGS. 4 and 5, with the flange 52 engaging the helical channel 50, rotation of the lock ring 40 in the clockwise direction 44 directs the lock ring 40 downward toward the circuit board 24, and conversely, rotation of the lock ring 40 in the counterclockwise direction 46 directs the lock ring 40 upward from the circuit board 24.

Other examples can implement other components to permit rotation of the lock ring 40 that directs the lock ring 40 downward to and upward from the circuit board 24. For example, threaded surfaces between the interior sidewall of the lock ring housing 36 and the lateral exterior of the lock ring 40 may be implemented. Also, a push-and-twist mechanism may be implemented. For the push-and-twist mechanism, for example, the lock ring housing 36 and the lock ring 40 may have overlapping extensions (e.g., tabs) designed for the lock ring housing 36 to hold the lock ring 40 in place, but spaces between the extensions of the lock ring housing 36 allow the extensions of the lock ring 40 to pass therethrough before twisting or after untwisting. Further, although the flanges 52 are described as being on the lock ring 40 and the helical channels 50 as being on the lock ring housing 36, flanges can be on the lock ring housing, and helical channels can be on the lock ring. Various mechanisms for directing the lock ring 40 downward and upward can be implemented.

Figure 7B:
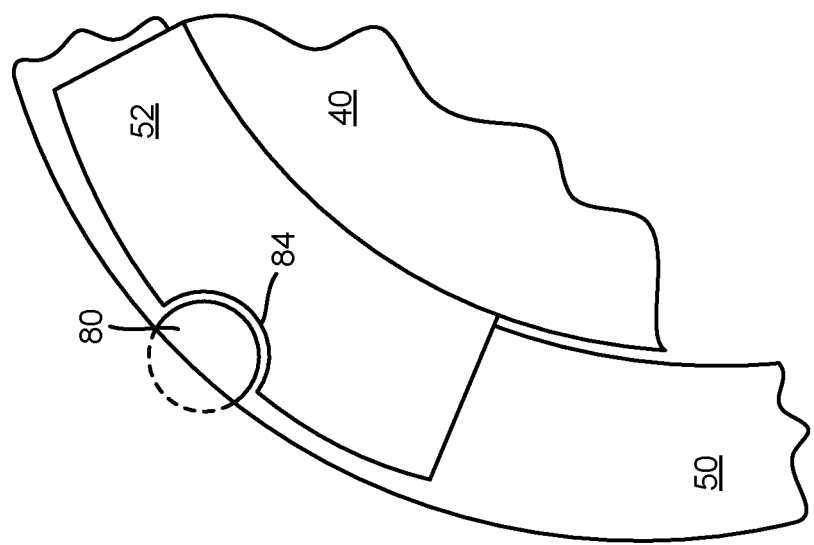
FIGS. 7A and 7B are a cross-sectional view and a plan view, respectively, of the first example locking mechanism in a "locked" position, in accordance with an example of the present disclosure.
Figure 7A:
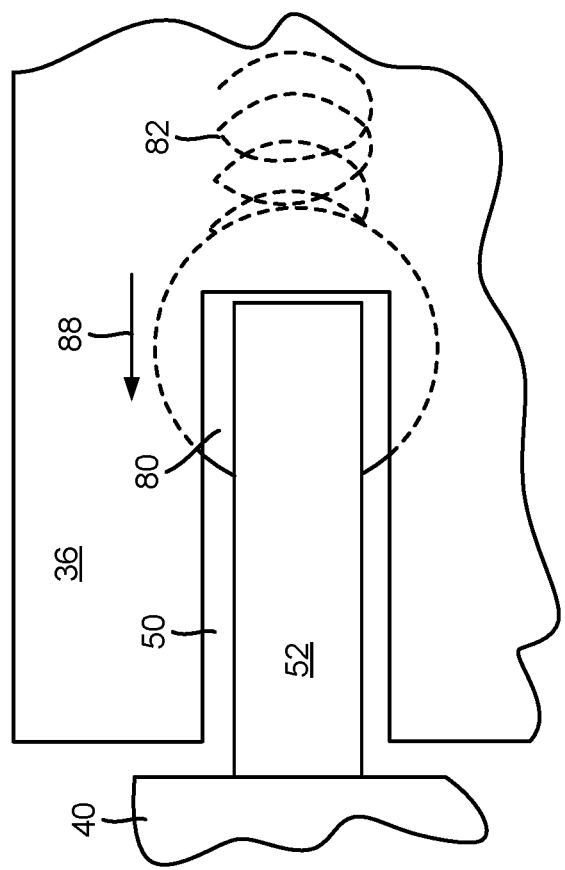

FIGS. 6A and 6B are a cross-sectional view and a plan view, respectively, of a first example locking mechanism in an "unlocked" position, in accordance with an example of the present disclosure. FIGS. 7A and 7B are a cross-sectional view and a plan view, respectively, of the first example locking mechanism in a "locked" position, in accordance with an example of the present disclosure.

The first example locking mechanism includes a ball bearing 80 that is capable of radial traversal in a helical channel 50 of the lock ring housing 36. The first example locking mechanism further includes a spring 82 disposed in the lock ring housing 36 that engages and is coupled to the ball bearing 80. The spring 82 provides a force to the ball bearing 80 that, unless opposed, causes the ball bearing 80 to traverse inwardly in a radial direction towards the interior of the lock ring housing 36. The flange 52 of the lock ring 40 has a notch 84 along an exterior of the flange 52 that corresponds to the ball bearing 80 when the lock ring 40 is in the "locked" position.

From the "unlocked" position shown in FIGS. 6A and 6B, the lock ring 40 can be rotated in the clockwise direction 44. As the lock ring 40 is rotated in the clockwise direction 44 and the flange 52 moves along the helical channel 50, the flange 52 contacts the ball bearing 80 and provides a force opposing the force provided by the spring 82, which causes the ball bearing 80 to move outwardly in a radial direction 86. When the lock ring 40 reaches the "locked" position, the notch 84 on the flange 52 aligns with the ball bearing 80, and the force provided by the flange 52 contacting the ball bearing 80 and opposing the force provided by the spring 82 is removed, which causes the ball bearing 80 to move inwardly in a radial direction 88 to engage the notch 84, as shown in FIGS. 7A and 7B. When the ball bearing 80 initially engages the notch 84, the ball bearing 80 may cause a "clicking" sensation, for example. With the ball bearing 80 engaging the notch 84 of the flange 52 and the spring 82 providing the force to the ball bearing 80, the lock ring 40 may be locked to prevent rotation (e.g., in the counterclockwise direction 46) without the application of some outside force to rotate the lock ring 40.

Figure 9B:
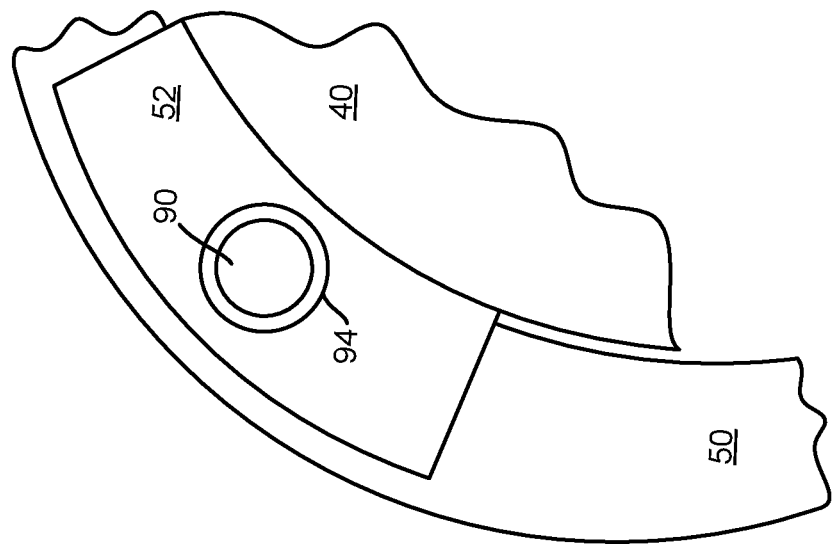
FIGS. 9A and 9B are a cross-sectional view and a plan view, respectively, of the second example locking mechanism in a "locked" position, in accordance with an example of the present disclosure.
Figure 9A:
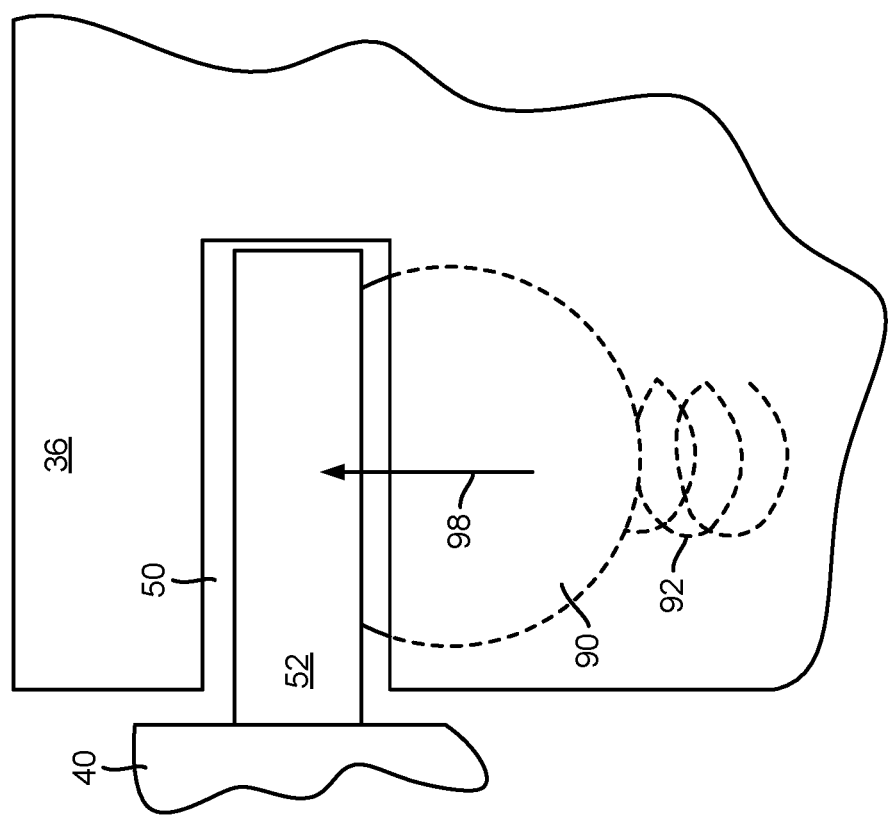

FIGS. 8A and 8B are a cross-sectional view and a plan view, respectively, of a second example locking mechanism in an "unlocked" position, in accordance with an example of the present disclosure. FIGS. 9A and 9B are a cross-sectional view and a plan view, respectively, of the second example locking mechanism in a "locked" position, in accordance with an example of the present disclosure.

The second example locking mechanism includes a ball bearing 90 that is capable of vertical traversal in a helical channel 50 of the lock ring housing 36. The second example locking mechanism further includes a spring 92 disposed in the lock ring housing 36 that engages and is coupled to the ball bearing 90. The spring 92 provides a force to the ball bearing 90 that, unless opposed, causes the ball bearing 90 to traverse upwardly in a vertical direction away from the circuit board 24. The flange 52 of the lock ring 40 has an aperture 94 through the flange 52 that corresponds to the ball bearing 90 when the lock ring 40 is in the "locked" position.

From the "unlocked" position shown in FIGS. 8A and 8B, the lock ring 40 can be rotated in the clockwise direction 44. As the lock ring 40 is rotated in the clockwise direction 44 and the flange 52 moves along the helical channel 50, the flange 52 contacts the ball bearing 90 and provides a force opposing the force provided by the spring 92, which causes the ball bearing 90 to move vertically in a downward direction 96. When the lock ring 40 reaches the "lock" position, the aperture 94 on the flange 52 aligns with the ball bearing 90, and the force provided by the flange 52 contacting the ball bearing 90 and opposing the force provided by the spring 92 is removed, which causes the ball bearing 90 to move vertically in an upward direction 98 to engage the aperture 94, as shown in FIGS. 9A and 9B. When the ball bearing 90 initially engages the aperture 94, the ball bearing 90 may cause a "clicking" sensation, for example. With the ball bearing 90 engaging the aperture 94 of the flange 52 and the spring 92 providing the force to the ball bearing 90, the lock ring 40 may be locked to prevent rotation (e.g., in the counterclockwise direction 46) without the application of some outside force to rotate the lock ring 40.

An additional and/or alternative safety mechanism may be provided. For example, the lock ring 40 may have one or more holes therethrough that align with respective one or more holes through the circuit board 24 and rigid substrate 22 when the lock ring 40 is in the "locked" position. A clevis pin (secured using a split pin) or another fastener may be inserted through the respective aligned holes when the lock ring 40 is in the "locked" position. The clevis pin may prevent the lock ring 40 from rotation, which may rotate the lock ring 40 into the "unlocked" position, during wafer sorting or probe testing, as described below, due to wafer touch down in which an external force (e.g., a 900 N force) can be applied to the wafer by the probe assembly 20.

Figure 10A:
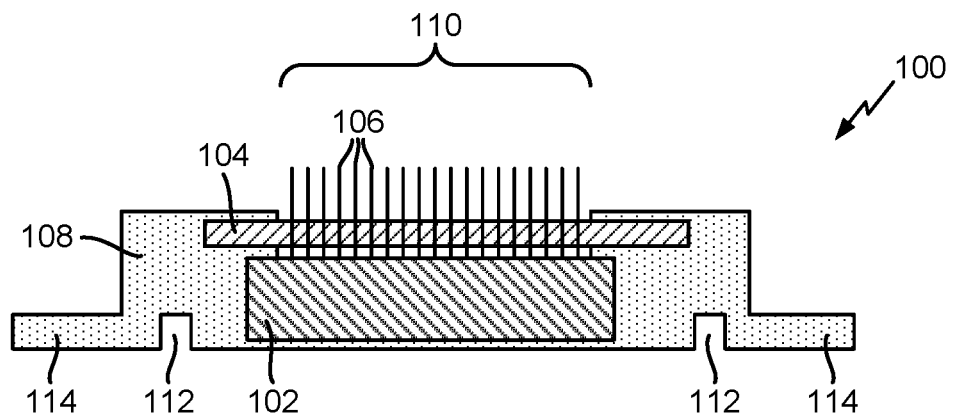
FIGS. 10A and 10B are a cross-sectional view and a plan view, respectively, of an example probe head assembly, in accordance with an example of the present disclosure.
Figure 10B:
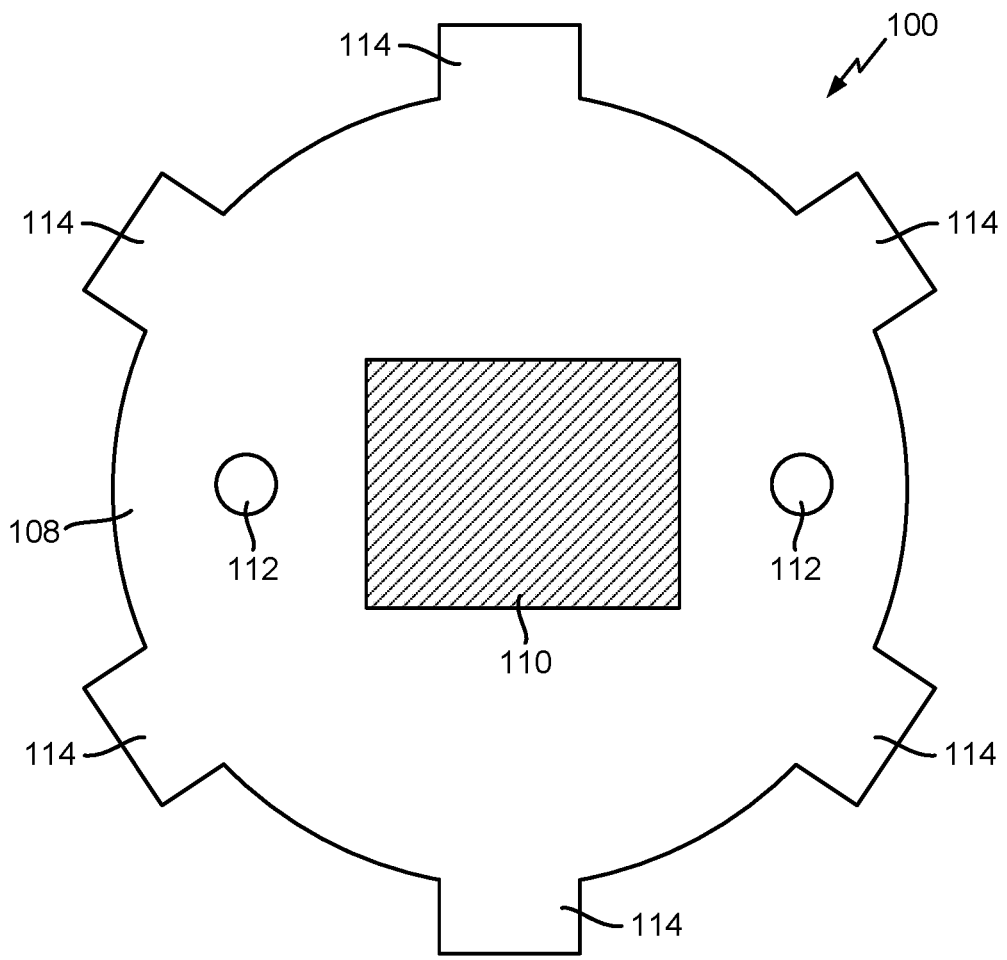

FIGS. 10A and 10B are a cross-sectional view and a plan view, respectively, of an example probe head assembly 100, in accordance with an example of the present disclosure. The probe head assembly 100 includes a probe substrate 102, a probe guide plate 104 with pins 106, and a probe stiffener 108. The probe substrate 102 can provide for redistribution of electrical interconnections between, e.g., contacts on an interposer substrate and the pins 106 through the probe guide plate 104. The probe substrate 102 may be a multi-layer ceramic (MLC) substrate or another substrate. The probe guide plate 104 provides support for the pins 106 to make electrical contact with the probe substrate 102 and, during testing, contacts on a wafer. A probe pin area 110, in which the pins 106 are disposed, is illustrated generally.

The probe stiffener 108 can be a rigid substrate that secures the probe substrate 102 and probe guide plate 104 with pins 106 together. In some examples, the probe stiffener 108 can be formed from steel, aluminum, titanium, nickel, a metal alloy, an organic epoxy, a ceramic, or other material. The probe stiffener 108 includes guide pin holes 112 for engaging respective guide pins when the probe head assembly 100 is attached to a probe assembly. The probe stiffener 108 further has projections 114 that correspond to a pattern of an aperture of a lock ring for interchanging probe head assemblies, where the lock ring is for securing the probe head assembly 100 to the probe assembly.

Figure 11:
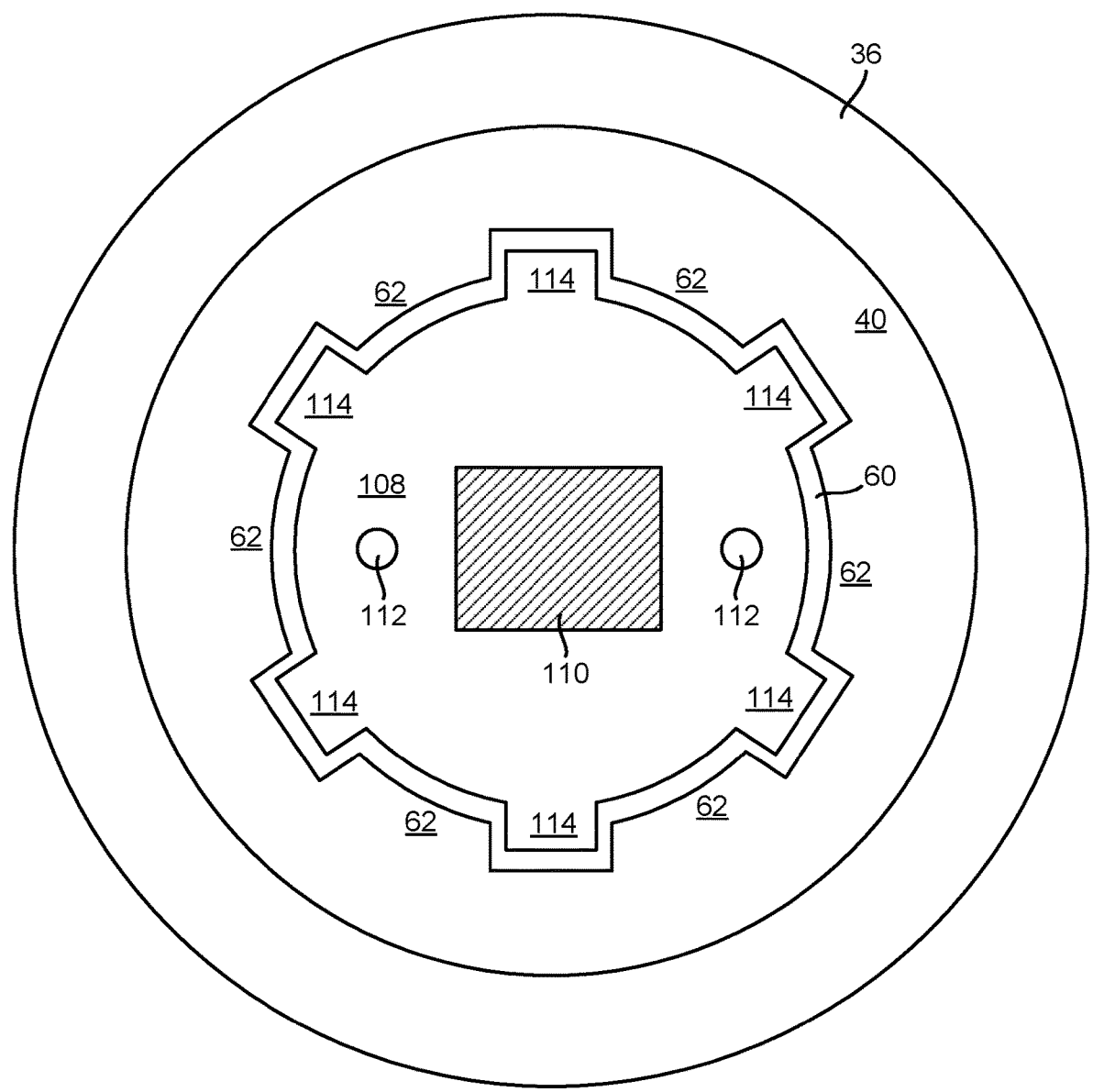
FIG. 11 is a top view of bringing a probe head assembly and a probe assembly into alignment for securing the probe head assembly in the probe assembly, in accordance with an example of the present disclosure.
Figure 12:
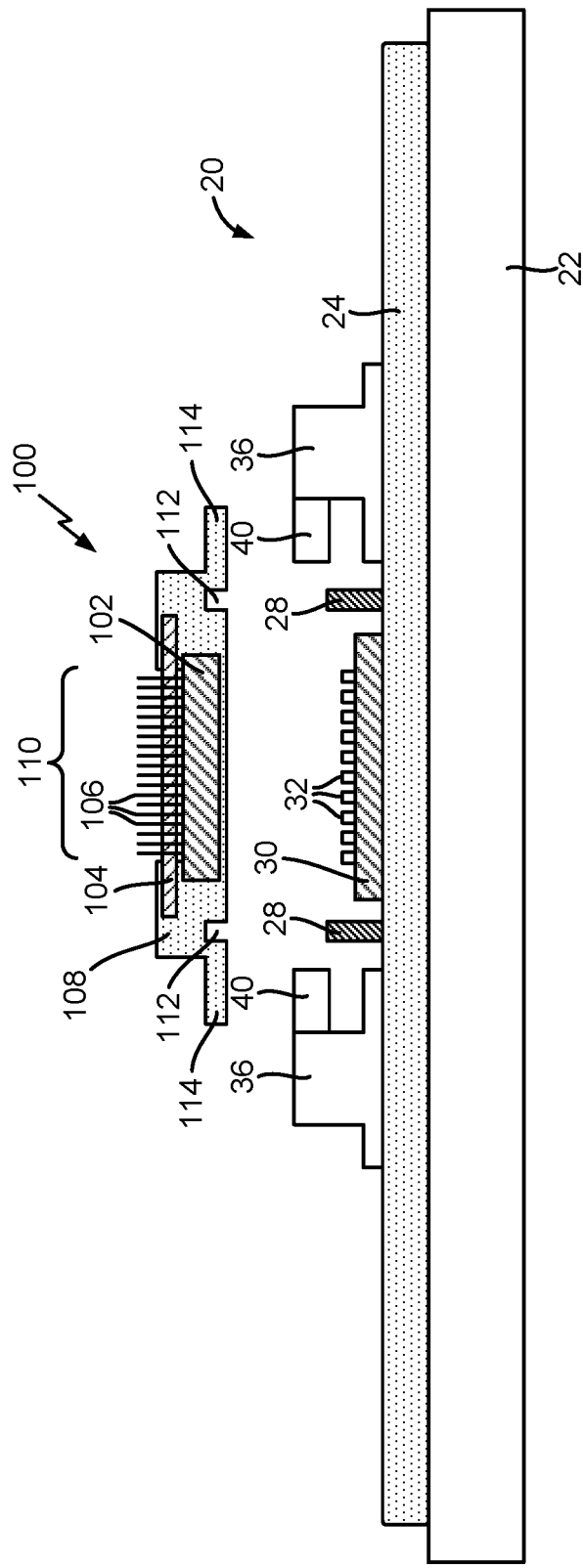
FIG. 12 is a cross-sectional view of bringing the probe head assembly and the probe assembly into alignment for securing the probe head assembly in the probe assembly, in accordance with an example of the present disclosure.

FIGS. 11 through 14 illustrate operations to secure the probe head assembly 100 in the probe assembly 20, in accordance with an example of the present disclosure. FIGS. 11 and 12 are a top view and a cross-sectional view, respectively, of bringing the probe head assembly 100 and the probe assembly 20 into alignment before securing the probe head assembly 100 in the probe assembly 20, in accordance with an example of the present disclosure. The lock ring 40 is positioned in the "unlocked" position. The guide pin holes 112 of the probe stiffener 108 are aligned vertically to the guide pins 28 on the circuit board 24. With the lock ring 40 being in the "unlocked" position and the guide pin holes 112 aligned with the guide pins 28, projections 114 of the probe stiffener 108 are aligned between projections 62 of the lock ring 40.

Figure 13:
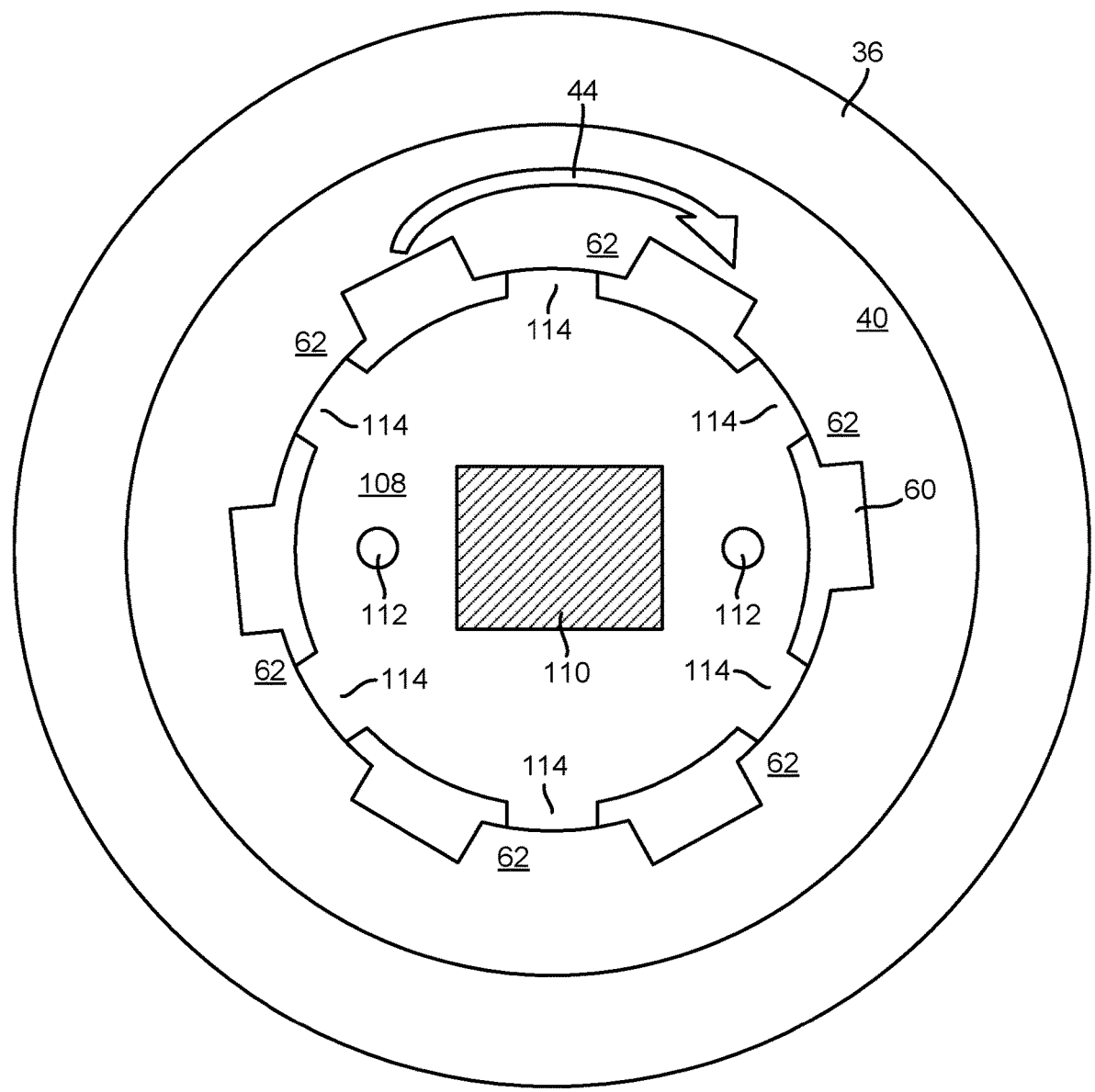
FIG. 13 is a top view of inserting and securing the probe head assembly into the probe assembly, in accordance with an example of the present disclosure.
Figure 14:
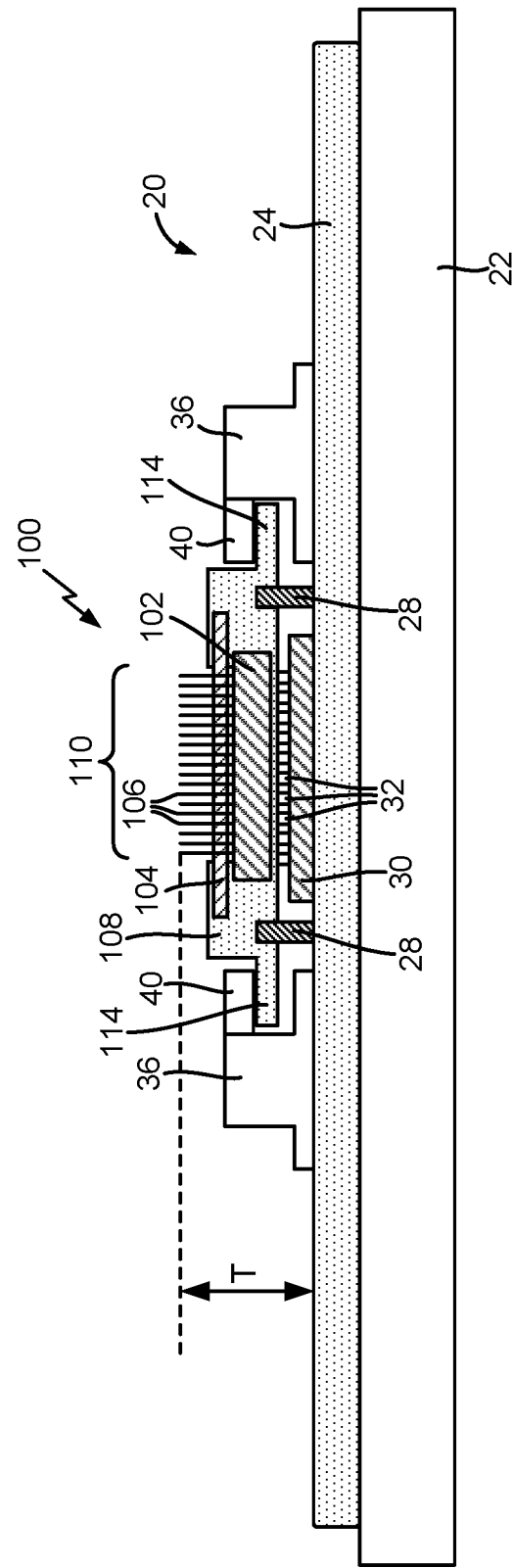
FIG. 14 is a cross-sectional view of inserting and securing the probe head assembly into the probe assembly, in accordance with an example of the present disclosure.

FIGS. 13 and 14 are a top view and a cross-sectional view, respectively, of inserting and securing the probe head assembly 100 into the probe assembly 20, in accordance with an example of the present disclosure. With the alignment described with respect to FIGS. 11 and 12, the probe head assembly 100 is inserted through the aperture 60 of the lock ring 40. With this insertion, contacts on a lower side (as illustrated) of the probe substrate 102 are brought into electrical contact with the contacts 32 of the interposer substrate 30, and the guide pins 28 engage the guide pin holes 112. Further, the projections 114 of the probe stiffener 108 are positioned vertically between the lock ring 40 and the circuit board 24.

With the probe head assembly 100 inserted in the probe assembly 20, the lock ring 40 is rotated in the clockwise direction 44 to the "locked" position to secure the probe head assembly 100. With the rotation, the projections 62 of the lock ring 40 begin to overlap the projections 114 of the probe stiffener 108. When the lock ring 40 is in the "locked" position, the projections 62 of the lock ring 40 overlap the projections 114 of the probe stiffener 108. Further, with the rotation in the clockwise direction 44, the helical channels 50 in the lock ring housing 36, and the flanges 52 of the lock ring 40 engaged therein, force the lock ring 40 downward relative to the circuit board 24 and rigid substrate 22. With the vertical overlap of the projections 62 of the lock ring 40 with the projections 114 of the probe stiffener 108, the downward force applied to the lock ring 40 in turn causes a downward force on the projections 114 of the probe stiffener 108, thereby securing the probe head assembly 100 in the probe assembly 20. A locking mechanism, such as previously described, can generally provide a force to keep the lock ring 40 in the "locked" position unless an outside force is applied to rotate the lock ring 40 in the counterclockwise direction 46. Also of note, translation and/or rotation of the probe head assembly 100 during the rotation of the lock ring 40 or other usage of the probe assembly 20 may be prevented by the guide pins 28 on the circuit board 24 engaging the guide pin holes 112 on the probe stiffener 108. Once the probe head assembly 100 is secured, a thickness T of the probe assembly 20 with the probe head assembly 100 from the surface of the circuit board 24 opposite from the rigid substrate 22 to tips of the pins 106 opposite from the circuit board 24 can be, for example, 20 mm.

Figure 15:
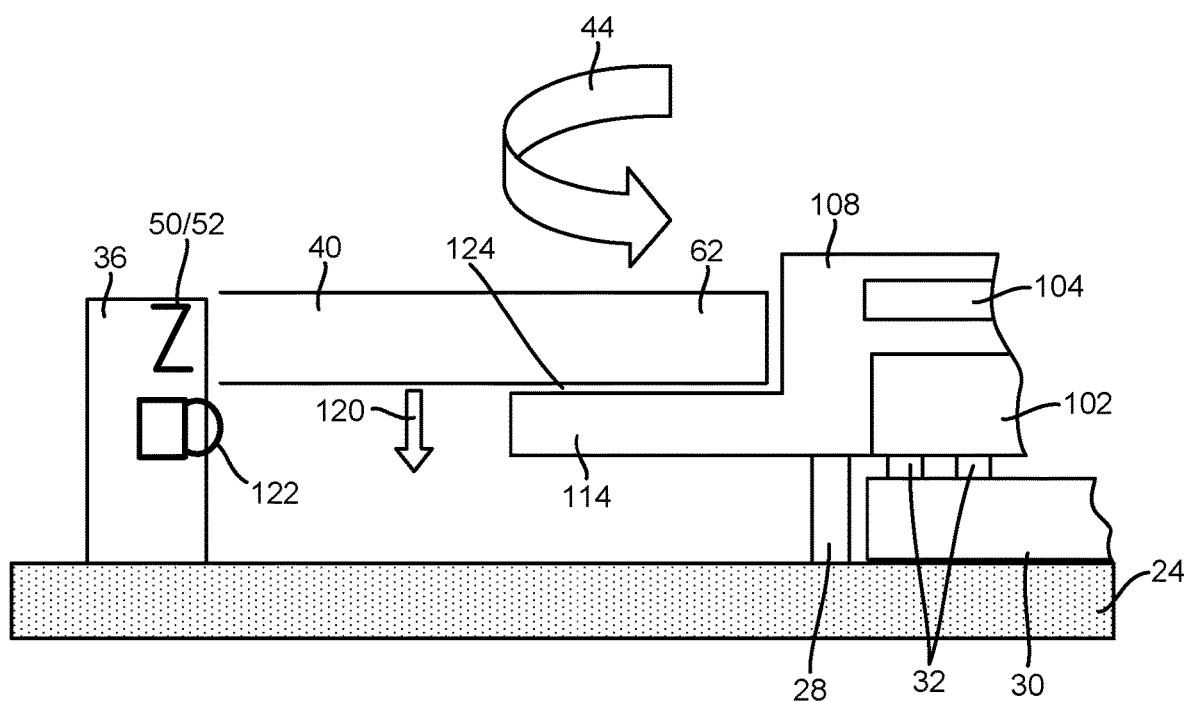
FIG. 15 is a cross-sectional view of a portion of the probe head assembly in the probe assembly, in accordance with an example of the present disclosure.

FIG. 15 is a cross-sectional view of a portion of the probe head assembly 100 in the probe assembly 20, in accordance with an example of the present disclosure. FIG. 15 illustrates additional details of the securing operation described above with respect to FIGS. 13 and 14. As the lock ring 40 is rotated in the clockwise direction 44, the helical channels 50 with flanges 52 engaged therein causes downward movement 120 of the lock ring 40 relative to the circuit board 24. This downward displacement of the lock ring 40 is then locked by a locking mechanism 122, such as the ball bearing 80 and notch 84 or other suitable mechanisms previously described, when the lock ring 40 reaches the "locked" position.

Additionally, projections 114 of the probe stiffener 108 are generally statically positioned while the lock ring 40 is rotated, and surfaces of the projections 62 of the lock ring 40 and of the projections 114 of the probe stiffener 108 may become in contact during this rotation. Hence, in some examples, a low friction material, such as Teflon®, may be coated on one or more of the surfaces at an interface 124 between a projection 62 of the lock ring 40 and a projection 114 of the probe stiffener 108. Such a low friction material can permit the surfaces to slide against each other while minimizing forces between the surfaces that could cause damage and/or produce debris.

Although example configurations of the probe stiffener 108 with projections 114 and the lock ring 40 with the aperture 60 and projections 62 have been illustrated and described herein, other example configurations may be implemented. A consideration for any configuration for a probe stiffener and lock ring is to attempt to maintain planarity of the probe stiffener, and thereby, planarity of the probe substrate and probe guide plate. To the extent possible, the lock ring should apply an equal force uniformly around the probe stiffener to avoid warping the probe stiffener. The layout patterns of the probe stiffener and aperture of the lock ring may be designed to apply equal force as uniformly around the probe stiffener as is practical.

With the probe head assembly 100 secured in the probe assembly 20, the probe assembly 20 may be used for wafer sorting or probe testing. For example, the pins 106 may be brought into electrical connection with contacts on a wafer. A processor-based system (e.g., a computer) can provide electrical signals that are routed along the circuit board 24, through the interposer substrate 30 and at least some of the contacts 32, through the probe substrate 102, and through at least some of the pins 106 to contacts on the wafer. The integrated circuits and/or structures under test on the wafer may then provide responses to the electrical signals. The responses are routed from contacts on the wafer through at least some of the pins 106, through the probe substrate 102, through the interposer substrate 30 and at least some of the contacts 32, and along the circuit board 24 to the processor-based system, which processes the received responses to determine whether a fault or defect exists in the integrated circuits and/or structures under test on the wafer.

After wafer sorting or probe testing using the probe head assembly 100 in the probe assembly 20, the probe head assembly 100 may be removed from the probe assembly 20. Generally, the operations for inserting and securing the probe head assembly 100 in the probe assembly 20 are performed in reverse order. The lock ring 40 is rotated in the counterclockwise direction 46 until the lock ring 40 is in the "unlocked" position. In the "unlocked" position, the projections 114 of the probe stiffener 108 are vertically aligned between projections 62 of the lock ring 40, as illustrated in FIG. 11. The probe head assembly 100 may then be removed from the probe assembly 20 through the aperture 60 through the lock ring 40. Another probe head assembly, such as one having a different pin configuration, can then be inserted and secured in the probe assembly 20 for wafer sorting or probe testing additional wafers.

Figure 16:
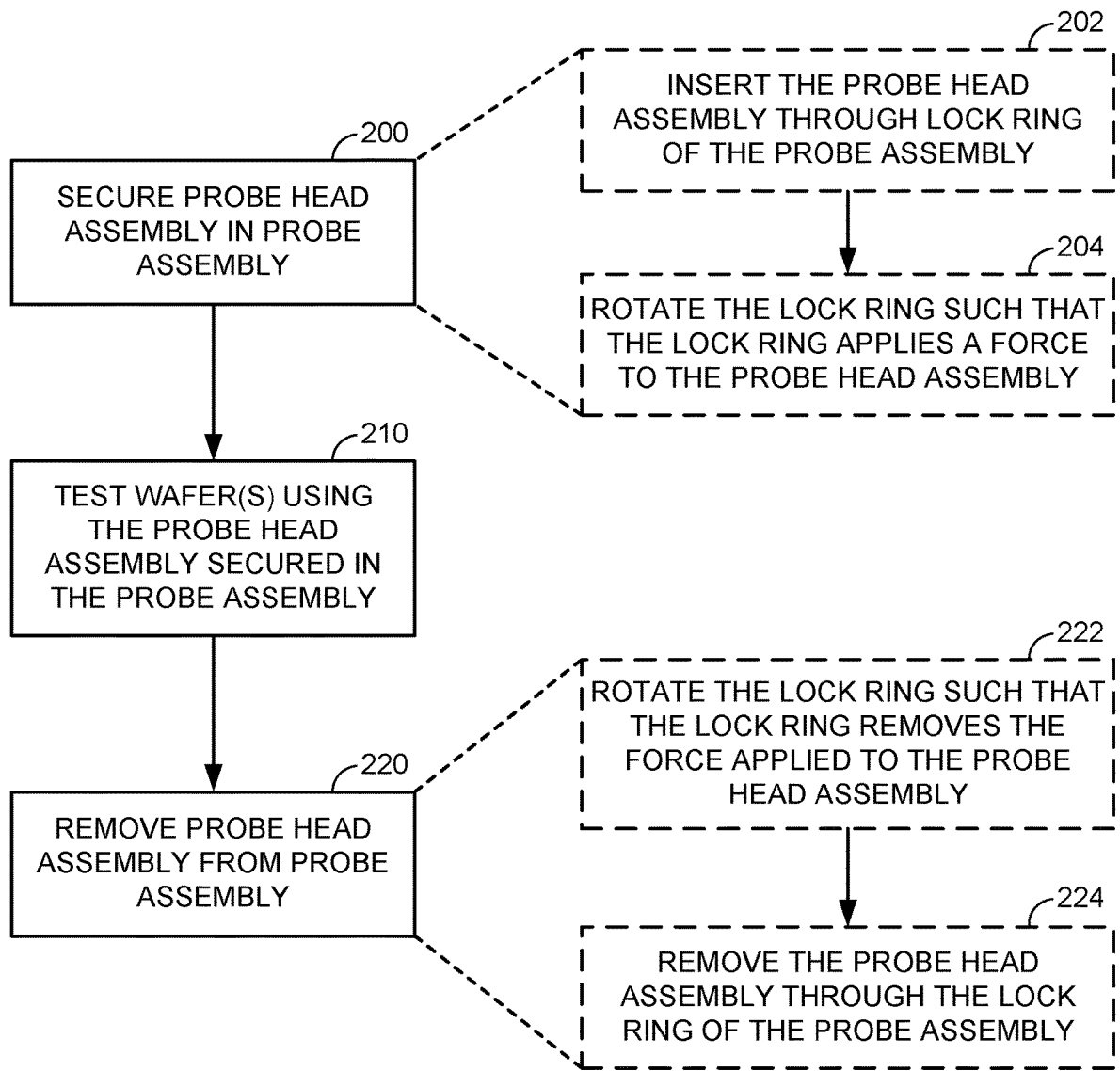
FIG. 16 is a flow diagram of example operations for testing a wafer, in accordance with an example of the present disclosure.

FIG. 16 is a flow diagram of example operations for testing a wafer, in accordance with an example of the present disclosure. In operation 200, a probe head assembly is secured in a probe assembly. Operation 200 may include, in operation 202, inserting the probe head assembly through a lock ring of the probe assembly, like illustrated in and described with respect to FIGS. 11 through 14. Operation 200 may further include, in operation 204, rotating the lock ring relative to the lock ring housing such that the lock ring applies a force to the probe head assembly, like also illustrated in and described with respect to FIGS. 11 through 14. In operation 210, the probe head assembly secured in the probe assembly is used to test one or more wafers. In optional operation 220, the probe head assembly is removed from the probe assembly. Operation 220 may include, in operation 222, rotating the lock ring relative to the lock ring housing such that the lock ring removes the force applied to the probe head assembly, as described above. Operation 220 may further include, in operation 224, removing the probe head assembly through the lock ring of the probe assembly, as described above.

Hence, some examples, such as described herein, can be implemented to permit changing, more easily, probe head assemblies from a probe assembly when transitioning between wafer sorting or probe testing wafers with different types of integrated circuits and/or test structures. Some examples can permit rotation of a lock ring, e.g., between "locked" and "unlocked" positions, without use of any tools—e.g., the force applied to rotate the lock ring may be applied simply by hand and without the use of any separate, discrete fasteners (e.g., metal screws). This can permit changing out probe head assemblies more easily and faster. Furthermore, wear and damage to fasteners is avoided, thereby preventing the potential for any debris that might otherwise cause failures (e.g., due to shorts) during testing.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A probe assembly comprising:
   a rigid substrate;
   a circuit board coupled to the rigid substrate, the circuit board having a surface; and
   a probe head securing mechanism comprising:
   a lock ring housing coupled to the rigid substrate, the circuit board being disposed between the lock ring housing and the rigid substrate; and a lock ring disposed within the lock ring housing, the lock ring being rotatable relative to the lock ring housing, rotation of the lock ring being configured to move the lock ring in a direction perpendicular to the surface of the circuit board.

2. The probe assembly of claim 1, wherein the lock ring housing has an interior sidewall at least partially encircling the lock ring.

3. The probe assembly of claim 2, wherein:
the interior sidewall has a helical channel;
the lock ring has a flange along a lateral exterior; and
the flange is engaged in the helical channel.

4. The probe assembly of claim 1, wherein the lock ring has a central aperture, the central aperture being configured to permit a probe head assembly to be inserted therethrough and to secure the probe head assembly within the probe head securing mechanism upon insertion of the probe head assembly and rotation of the lock ring relative to the lock ring housing.

5. The probe assembly of claim 1, wherein the lock ring has a central aperture, the lock ring having a plurality of projections extending in a direction towards a center of the central aperture.

6. The probe assembly of claim 1, wherein:
the probe head securing mechanism further includes a ball bearing coupled to a spring;
the lock ring has a notch or a hole; and
the ball bearing and the spring are positioned to engage the notch or the hole of the lock ring when the lock ring is in a position configured to secure a probe head assembly within the probe head securing mechanism.

7. The probe assembly of claim 1, wherein:
the lock ring has a central aperture, the central aperture being configured to permit a probe head assembly to be inserted therethrough; and
at least two guide pins extend from the circuit board, the at least two guide pins being positioned to engage the probe head assembly upon being inserted through the central aperture.

8. The probe assembly of claim 1, wherein the probe head securing mechanism is configured such that:
rotation of the lock ring in a clockwise direction relative to the lock ring housing moves the lock ring in a direction toward the surface of the circuit board, and
rotation of the lock ring in a counterclockwise direction relative to the lock ring housing moves the lock ring in a direction away from the surface of the circuit board.

9. A method of testing, comprising:
securing a probe head assembly in a probe assembly comprising:
inserting the probe head assembly through a lock ring of the probe assembly, the lock ring being at a first position relative to a lock ring housing of the probe assembly, the lock ring being disposed in the lock ring housing of the probe assembly, the lock ring housing being attached to a rigid substrate of the probe assembly, a circuit board being disposed between the lock ring housing and the rigid substrate; and
rotating the lock ring relative to the lock ring housing to a second position relative to the lock ring housing, the lock ring at the second position applying a force to the probe head assembly to secure the probe head assembly; and
testing a wafer using the probe head assembly secured in the probe assembly.

10. The method of claim 9 further comprising, after testing the wafer, removing the probe head assembly from the probe assembly comprising:
rotating the lock ring relative to the lock ring housing to the first position relative to the lock ring housing; and
removing the probe head assembly through the lock ring at the first position relative to the lock ring housing.

11. The method of claim 10, wherein:
rotating the lock ring relative to the lock ring housing to the second position relative to the lock ring housing is in a clockwise direction; and
rotating the lock ring relative to the lock ring housing to the first position relative to the lock ring housing is in a counterclockwise direction.

12. The method of claim 9, wherein:
the lock ring housing has an interior sidewall at least partially encircling the lock ring;
the interior sidewall has a helical channel;
the lock ring has a flange along a lateral exterior;
the flange is engaged in the helical channel; and
rotating the lock ring relative to the lock ring housing causes the flange to move along the helical channel.

13. The method of claim 9, wherein:
the lock ring has a central aperture having an aperture layout pattern, the lock ring having locking projections extending toward a center of the central aperture;
the probe head assembly has a probe head layout pattern corresponding to the aperture layout pattern, the probe head assembly having probe projections in the probe head layout pattern;
the probe head assembly is inserted through the central aperture of the lock ring;
as the probe head assembly is being inserted through the central aperture, the probe projections extend between respective neighboring pairs of the locking projections; and
when the lock ring is at the second position securing the probe head assembly, the locking projections overlap and apply the force to the probe projections.

14. The method of claim 9, wherein inserting the probe head assembly through the lock ring comprises engaging at least two guide pins extending from the circuit board to respective guide pin holes of the probe head assembly.

15. The method of claim 9, wherein, at the second position relative to the lock ring housing, a ball bearing of the lock ring housing engages a notch or a hole of the lock ring.

16. A probe assembly comprising:
a rigid substrate;
a circuit board coupled to the rigid substrate; and
a probe head securing mechanism comprising:
a lock ring having a flange along a lateral exterior; and
a lock ring housing coupled to the rigid substrate, the circuit board being disposed between the lock ring housing and the rigid substrate, the lock ring housing having an interior sidewall at least partially encircling the lock ring, the interior sidewall having a helical channel, the flange of the lock ring being engaged in the helical channel, the lock ring being rotatable relative to the lock ring housing, the flange being moveable along the helical channel during rotation of the lock ring.

17. The probe assembly of claim 16, wherein:
the lock ring has a central aperture configured to permit a probe head assembly to be inserted therethrough; and
the lock ring further has projections extending towards a center of the central aperture, the projections being configured to overlap and apply a force to at least a portion of the probe head assembly when the lock ring is rotated relative to the lock ring housing to a position to secure the probe head assembly in the probe head securing mechanism.

18. The probe assembly of claim 17, wherein respective surfaces of the projections configured to apply the force have Teflon® thereon.

19. The probe assembly of claim 16, wherein:
the probe head securing mechanism further includes a ball bearing coupled to a spring;
the lock ring has a notch or a hole; and
the ball bearing is positioned to engage the notch or the hole of the lock ring when the lock ring is in a position configured to secure a probe head assembly within the probe head securing mechanism.

20. The probe assembly of claim 16, wherein:
the lock ring has a central aperture, the central aperture being configured to permit a probe head assembly to be inserted therethrough; and
at least two guide pins extend from the circuit board, the at least two guide pins being positioned to engage the probe head assembly upon being inserted through the central aperture.

* * * * *